United States Patent [19]

Neuman

[11] Patent Number: 4,965,535
[45] Date of Patent: Oct. 23, 1990

[54] MULTIPLE SPEED OSCILLATOR
[75] Inventor: Darren D. Neuman, Sunnyvale, Calif.
[73] Assignee: National Semiconductor Corporation, Santa Clara, Calif.
[21] Appl. No.: 373,766
[22] Filed: Jun. 30, 1989
[51] Int. Cl.[5] ........................ H03B 5/36; H03F 3/16
[52] U.S. Cl. ........................ 331/116 FE; 331/108 A; 331/158; 331/179; 330/277
[58] Field of Search .......... 331/108 A, 108 C, 116 R, 331/116 FE, 117 R, 117 FE, 158, 160, 161, 177 R, 179; 330/277, 278, 284, 144, 145

[56] References Cited
U.S. PATENT DOCUMENTS
4,218,661 8/1980 Imamura ................... 331/116 FE Primary Examiner—David Mis
Attorney, Agent, or Firm—Gail W. Woodward; Lee Patch; Michael A. Glenn

[57] ABSTRACT

A CMOS oscillator is disclosed using an inverter in which a pair of control terminals are employed to invoke various sized devices which control the flow of current. The inverter gain is determined by the size of the CMOS devices employed. A tuned circuit coupled to the inverter causes it to oscillate at the frequency of parallel resonance. The control terminals are coupled to the inverter invoke transistors that are sized as desired to establish the current flow and gain in the inverter. The current flow is controlled to optimize the gain of the inverter in terms of the frequency of oscillation. A Schmitt trigger can be employed to clean up the oscillator output for digital clock source applications.

6 Claims, 1 Drawing Sheet

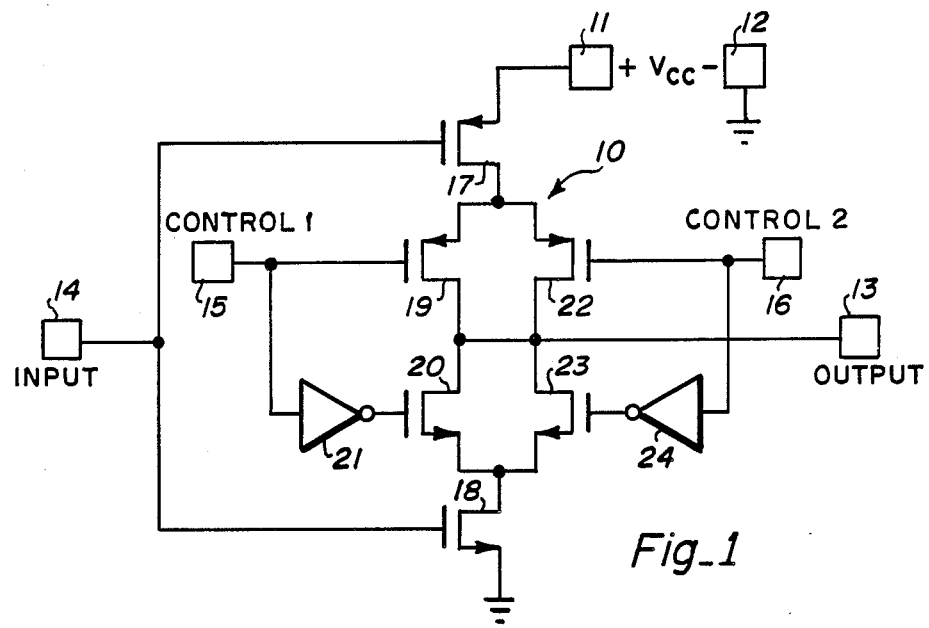
Fig_1
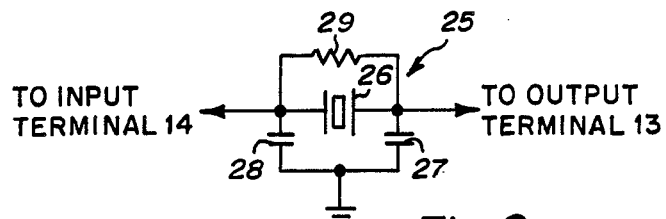
Fig_2
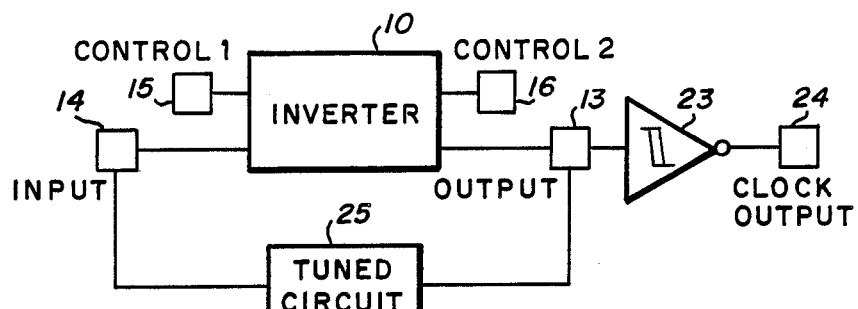
Fig_3

MULTIPLE SPEED OSCILLATOR

BACKGROUND OF THE INVENTION

The invention relates to transistor oscillators in general and to CMOS circuits in particular. It has been found that in order to operate such oscillators at high frequencies, large area transistors must be used and they tend to draw large power supply currents. When low frequency operation is desired smaller lower current transistors will suffice. The simplest oscillator comprises an inverter amplifier that has sufficient gain to overcome the losses in a tuned circuit that couples the output back to the input. In this configuration the tuned circuit provides a phase inversion so that the inverter plus tuned circuit combination is oscilatory. One of the best known combinations involves a CMOS inverter with a quartz crystal coupled from the output back to the input. When the crystal is operated in its parallel resonance mode the required signal inversion is available.

In general, the higher the frequency of operation the higher the CMOS inverter gain required. This means that the device size must be determined for the frequency of the application. It also means that when the device is operated at a lower than design frequency the large devices will draw more power supply current than needed. This can be undesirable particularly for battery operated applications.

In the prior art it has been recognized that while a CMOS oscillator can be made to run very efficiently, the use of relatively small area devices will result in a circuit that is difficult to start up upon the application of power. Such a condition is disclosed in U.S. Pat. No. 4,218,661 which issued to Yoichi Imamura on Aug. 19, 1980. A CMOS oscillator is disclosed along with means to increase the closed loop gain when it is desired to start the circuit. The teaching in this patent is incorporated herein by reference.

SUMMARY OF THE INVENTION

It is object of the invention to provide an oscillator circuit based upon a cascode amplified inverter whose gain can be varied in response to a digital control input.

It is a further object of the invention to provide a CMOS oscillator circuit wherein large area devices are employed for high frequecy operation and switchable small area transistors are emplyed for low frequency operation.

In is a still further object of the invention to couple a Schmitt trigger to the output of a multiple speed osicllator to produce a clean clock output.

These and other object are achieved in the following manner. A first pair of relatively large area (high gain) complementary transistors have gates commonly connected to the circuit input terminal and their sources connected respectively to the power supply rails. A second pair of relatively large area complementary transistors are connected between the drains of the first pair and the circuit output terminal. This second pair of transistors are operated as switches from a first control signal that drives them complementarily so that they are on or off together. A third pair of relatively small (low gain) complementary transistors are connected in parallel with the second pair and their gates are driven in conplementary fashion from a second control terminal. Thus, the third pair of transistors also operate as switches. When the control signals turn both the second and third pairs of transistors off the circuit is inoperative and therefore off. When the second pair of transistors alone are turned one first pair of transistors will be coupled to the output terminals by means of large area switches so that a high gain (large area) inverter action is present. When the third pair of transistors only are turned on along the first pair of transistors will be coupled to the output terminal by means of small area transistors and a low gain (small area) inverter is present. When both second and third pairs of transistors are turned on, the highest gain condition will be present. If a resonant circuit, such as a quartz crystal, is connected between the output and input terminals an oscillator action will develop. The circuit gain can be selected, by way of the control signal, to optimize the circuit operation in terms of the frequency. The highest operating frequency will be invoked by turning both the second and third pairs of transistors on. At the lowest frequencies only the third pair will be turned on. Thus, an operating current economy can be produced as desired. Finally, if desired, a Schmitt trigger inverter can be coupled to the output of the oscillator circuit. Its output will be an inversion of the oscillator output, but it will produce a noise-free rail-to-rail clock output. Furthermore, when starting up the initial cycles of oscillation will be ignored and the output will be present only after the oscillator has gained substantially full amplitude operation.

BRIEF DESCRIPTION OF THE DRAWING

FIG. 1 is a schematic diagram of the inverter circuit of the invention.

FIG. 2 is a schematic diagram of a quartz crystal circuit that will provide oscillatory feedback for the circuit of FIG. 1.

FIG. 3 is a block diagram showing an improved circuit of the invention.

DESCRIPTION OF THE INVENTION

With reference to FIG. 1, the cascode amplified inverter circuit 10 is operated from a $V_{CC}$ power supply connected + to terminal 11 and − to ground terminal 12. The output of inverter 10 appears at terminal 13 in response to the signal at input terminal 14. Control terminals 15 and 16 operate the circuit in response to control signals to determine the circuit performance as will be detailed hereinafter.

Transistors 17 and 18 comprise a first pair. They are complementary and have their gates connected to input terminal 14 and their sources are connected to the supply rails as is common in CMOS inverters. Transistors 17 and 18 are relatively large area devices and their drains are coupled respectively by means of switch transistors 19 and 20 to output terminal 13. Transistors 19 and 20 comprise a second pair. They are also relatively large area devices and their gates are operated complementarily, by virtue of inverter 21, from control terminal 15. When terminal 15 is low transistors 19 and 20 will be on and the inverter will be of high gain and will draw a relatively large supply current.

Transistors 22 and 23, which comprise a third pair, are relatively small area devices and their gates are operated complementarily by virtue of inverter 24. When transistors 22 and 23 are on, due to a low control terminal 16, it can be seen that the drains of transistors 17 and 18 are respectively coupled to output terminal 13 by transistors 22 and 23. In this state inverter 10 will be of low gain, because transistors 22 and 23 are small, and a low supply current will flow. The relative size of the large and small transistors are chosen so that the gain of the inverter is at the level desired.

It is to be understood that while the second and third pairs of switches are shown, more such pairs could be used. For example, a fourth pair could be coupled between the drains of transistors 17 and 18 and their juncture connected to terminal 13. An additional control terminal and inverter would be coupled to the gates of the fourth pair. In fact, any number of pairs could be added in this manner.

It is to be further understood that while CMOS transistors are shown other device types could be employed.

FIG. 2 is a schematic diagram of a tuned circuit 25 that could be connected between terminals 13 and 14 of the inverter 10 of FIG. 1 to create an oscillator. Tuned circuit 25 is composed of quartz crystal 26, capacitors 27 and 28 which tune the circuit and respectively swamp out the stray capacitances of the FIG. 1 circuit and resistor 29. The presence of resistor 29 ensures that in its quiescent or start-up state the invention 10 will be biased to its trip point. In operation the circuit will oscillate at the frequency of quartz crystal antiresonance where it will produce a 180° phase shift between terminal 13 and 14.

The following chart sets forth the operating conditions of the CMOS oscillator that results when the circuit of FIG. 2 is connected to that of FIG. 1. The transistor size (W/L Ratio) is chosen to provide a 10:1. ratio between the second and third pairs.

| CONTROL 1 | CONTROL 2 | CURRENT CONSUMPTION* | STATE |
|---|---|---|---|
| 1 | 1 | 0 | Off |
| 1 | 0 | 10% | Low Power |
| 0 | 1 | 80% | High Power |
| 0 | 0 | 82% | Highest Power |

*Relative to Current Consumption of normal CMOS inverter of size of pair 1.

It can be seen that the four states include a low power (low gain) state and two high power (high gain) states. The highest power state will be invoked where the highest operating frequency is to be employed. The state "00"highest power is easy to initialize on power-up, by holding Controls 1 and 2 low.

While the circuits of FIGS. 1 and 2 can be employed in a circuit that is configured manually it is expected that computer control will be the dominant operating made. In this mode a microprocessor (or other computer element) will be programmed to evaluate the circuit output. The state of the control terminals will then be commanded to optimize the circuit performance in terms of the application. For example, in battery operation reducing current drain is a primary objective.

FIG. 3 is a block diagram that illustrates a circuit improvement. Inverter 10 has a tuned circuit 25 coupled between terminal 13 and 14 to create a CMOS oscillator. Terminal 15 and 16 operate as described above to control circuit performance. A Schmitt buffer inverter trigger 23, having a controlled hysteresis, is coupled to output terminal 13. Such a hysteresis buffer is described and claimed in U.S. Pat. No. 3,984,703 to John M. Jorgensen. This patent, issued Oct. 5, 1976, is assigned to the assignee of the present invention. The terminal in that patent is incorporated herein by reference. The Jorgensen inverting Schmitt trigger is well known and is commercially available in hex form as MM54/74 C 14 and MM54-74 HC 14 integrated circuits available from National Semiconductor Corporation and others.

The controlled hysteresis of inverter 23 will result in an output at 24 of rail-to-rail amplitude clock pulses that represent the output of inverter/oscillator 10. In this manner, any noise at terminal 13 is ignored and a "clean" output is available. In addition, the use of hysteresis in inverter 23 will improve the start up performance. It is well known that an oscillator will typically require several operating cycles to reach full output. This is particularly true of oscillators operated at low power. When inverter 23 is present the oscillator output will have to increase to a level that exceeds the hysteresis level before an output is seen. Below hysteresis the output at terminal 24 will be zero. After the required number of cycles occur to exceed hysteresis, the output at terminal 24 will be a rail-to-rail digital clock signal. This will prevent the processor from operating on false clock signals generated by noise and, hence, prevent the processor from actually generating noise during oscillator start-up. This is crucial to ensure reliable start-up of the oscillator.

The invention has been described and its operation detailed. When a person skilled in the art reads the foregoing description, alternative and equivalents, within the spirit and intent of the invention, will be apparent. Accordingly, it is intended that the scope of the invention be limited only by the following claim.

I claim:

1. A multiple gain state amplifier circuit including input and output terminal between which a controlled gain is achieved in response to control input signals, said circuit comprising:
   a first two transistor inverter having the input electrodes of said two transistors connected to said input terminal and having the output electrodes of said two transistors coupled by first switch means to said output terminal, said first switch means being responsive to a first control input signal; and
   second switch means coupled between the output electrodes of said two transistors in said first inverter and said output terminal, said second swtich means being responsive to a second control input signal.

2. The amplifier circuit of claim 1 wherein the transistors in said first inverter and said first switch means employ relatively large transistors and said second switch means employs relatively small transistors.

3. The amplifier circuit of claim 2 wherein said transistors are CMOS devices.

4. The amplifier circuit of claim 3 wherein said first and second switch means each include a pair of complementary CMOS transistors respectively having their gates driven in complementary fashion by said control signals.

5. The amplifier circuit of claim 4 further including a resonant circuit coupled between said input annd output terminal whereby said circuit oscillates and said control signals are operated to produce the desired circuit function as determined by the frequency of oscillation.

6. The oscillator circuit of claim 5 further comprising a Schmitt trigger circuit having an input coupled to said oscillator output terminal thereby to provide a clean clock signal at the trigger circuit output.

* * * * *